US010764515B2

(12) United States Patent
Chang

(10) Patent No.: US 10,764,515 B2
(45) Date of Patent: Sep. 1, 2020

(54) IMAGE SENSOR METHOD AND APPARATUS EQUIPPED WITH MULTIPLE CONTIGUOUS INFRARED FILTER ELEMENTS

(71) Applicant: Futurewei Technologies, Inc., Plano, TX (US)

(72) Inventor: E-Cheng Chang, San Diego, CA (US)

(73) Assignee: Futurewei Technologies, Inc., Plano, TX (US)

( * ) Notice: Subject to any disclaimer, the term of this patent is extended or adjusted under 35 U.S.C. 154(b) by 41 days.

(21) Appl. No.: 15/640,758

(22) Filed: Jul. 3, 2017

(65) Prior Publication Data

US 2018/0013962 A1 Jan. 11, 2018

Related U.S. Application Data

(60) Provisional application No. 62/358,523, filed on Jul. 5, 2016.

(51) Int. Cl.
*H04N 5/30* (2006.01)
*H04N 5/33* (2006.01)
(Continued)

(52) U.S. Cl.
CPC .............. *H04N 5/332* (2013.01); *G02B 5/201* (2013.01); *H01L 27/14625* (2013.01);
(Continued)

(58) Field of Classification Search
CPC .............. H04N 5/332; H01L 27/14683; H01L 27/14645; H01L 27/14625; H01L 27/14649; G02B 5/201
(Continued)

(56) References Cited

U.S. PATENT DOCUMENTS 3,971,065 A     7/1976   Bayer
5,258,618 A * 11/1993   Noble ........................ G01J 5/08
                                                                           250/332
(Continued)

FOREIGN PATENT DOCUMENTS

CN         102130139 A      7/2011
CN         105025278 A     11/2015
(Continued)

OTHER PUBLICATIONS

International Search Report from PCT Application No. PCT/CN2017/091836, dated Sep. 29, 2017.
(Continued)

*Primary Examiner* — David P Porta
*Assistant Examiner* — Gisselle M Gutierrez
(74) *Attorney, Agent, or Firm* — Fish & Richardson P.C.

(57) ABSTRACT

An image sensor apparatus and method are provided with multiple contiguous infrared (IR) filter elements. Included is an image sensor comprising a two-dimensional array of pixel elements that generate output signals as pixel data for representing an image of a scene. Further included is a filter array comprising a two-dimensional array of filter elements coupled to the two-dimensional array of pixel elements to receive light input from the scene. The filter array includes a plurality of blocks of filter elements each including a first subset of filter elements configured to transmit spectral energy in one or more colors of a visible spectrum of the light. Each pair of adjacent filter elements of the first subset are configured to transmit spectral energy in different colors of the visible spectrum of the light. Further, each block of filter elements also includes a second subset of filter elements configured to transmit spectral energy in an infrared (IR) spectrum of the light. The second subset of filter
(Continued)

elements includes at least two (2) IR filter elements that are contiguous.

26 Claims, 11 Drawing Sheets

(51) Int. Cl.
*G02B 5/20* (2006.01)
*H01L 27/146* (2006.01)

(52) U.S. Cl.
CPC .. *H01L 27/14645* (2013.01); *H01L 27/14649* (2013.01); *H01L 27/14683* (2013.01)

(58) Field of Classification Search
USPC .................................................. 250/339.02
See application file for complete search history.

(56) References Cited

U.S. PATENT DOCUMENTS

| | | | |
|---|---|---|---|
| 2005/0285966 A1 | 12/2005 | Bamji et al. | |
| 2007/0024931 A1 | 2/2007 | Compton et al. | |
| 2007/0201859 A1 | 8/2007 | Sarrat | |
| 2009/0200451 A1 | 8/2009 | Conners | |
| 2010/0295947 A1* | 11/2010 | Boulanger | H04N 5/332 348/164 |
| 2011/0085063 A1* | 4/2011 | Min | H04N 5/332 348/280 |
| 2011/0175981 A1 | 7/2011 | Lai et al. | |
| 2011/0228097 A1* | 9/2011 | Motta | H04N 5/33 348/164 |
| 2013/0222552 A1* | 8/2013 | Agranov | H04N 13/286 348/49 |
| 2014/0184808 A1 | 7/2014 | Ryoki et al. | |
| 2014/0184810 A1* | 7/2014 | Sekiguchi | H01L 27/1461 348/164 |
| 2014/0240492 A1 | 8/2014 | Lee | |
| 2014/0263980 A1* | 9/2014 | Agranov | G01S 3/782 250/214.1 |
| 2014/0347442 A1 | 11/2014 | Wang et al. | |
| 2015/0002707 A1 | 1/2015 | Wu | |
| 2015/0281608 A1* | 10/2015 | Miyahara | G06T 3/4015 348/308 |
| 2015/0312537 A1* | 10/2015 | Solhusvik | H04N 9/045 348/302 |
| 2015/0350583 A1* | 12/2015 | Mauritzson | H04N 5/378 250/208.1 |
| 2016/0188963 A1 | 6/2016 | Kim | |
| 2017/0094260 A1* | 3/2017 | Agranov | H04N 13/286 |
| 2017/0150071 A1* | 5/2017 | Otsubo | G02B 5/20 |
| 2017/0320434 A1* | 11/2017 | Sato | B60R 1/00 |
| 2017/0374299 A1* | 12/2017 | Liu | H04N 5/332 |
| 2018/0160027 A1* | 6/2018 | Li | H04N 5/23212 |

FOREIGN PATENT DOCUMENTS

| | | |
|---|---|---|
| EP | 2763397 A1 | 8/2014 |
| EP | 2871843 A2 | 5/2015 |
| FR | 2975829 A1 | 11/2012 |
| JP | 2007526453 A | 9/2007 |
| JP | 2008177738 A | 7/2008 |
| JP | 2014116741 A | 6/2014 |
| JP | 2014140020 A | 7/2014 |
| JP | 2015012619 A | 1/2015 |

OTHER PUBLICATIONS

Okutomi et al., "New imaging system for simultaneous acquisition of color and near-infrared images," Tokyo Institute of Technology, Center for Public Affairs and Communications, 2016 pp. 1-3, retreived from http://www.titech.ac.jp/english/news/2016/035368.html.
Wikipedia, "Bayer filter," Wikipedia, Jun. 19, 2017, pp. 1-7, retreived from https://en.wikipedia.org/wiki/Bayer_filter.
Olympus Microscopy Resource Center, "Pixel Binning," 2012, pp. 1-2, retrieved from http://www.olympusmicro.com/primer/digitalimaging/concepts/binning.html.
K., Peter, "Samsung is working on "denser" mobile batteries and slimmer camera sensors, due out by 2017," phoneArena.com, May 2015, pp. 1-7, retrieved from https://www.phonearena.com/news/Samsung-is-working-on-denser-mobile-batteries-and-slimmer-camera-sensors-due-out-by-2017_id69681.
Stanford University, "Pixel Binning," Vista Lab Wiki, Stanford University, Aug. 2015, pp. 1-5, retrieved from https://web.stanford.edu/group/vista/cgi-bin/wiki/index.php/Pixel_Binning.
Gatan, "CCD vs. CMOS," Gatan, Inc., 2017, pp. 1-4, retrieved from http://www.gatan.com/ccd-vs-cmos.
Faceshift, "Faceshift powered by Intel Realsense: Be your Avatar," Intel, Apr. 2015, pp. 1-2, retrieved from https://www.youtube.com/watch?v=uiMnAmolK9s&feature=youtu.be.
Andor, "CCD Binning," Andor, Oxford Instruments, 2017, pp. 1-2, retrieved from http://www.andor.com/learning-academy/ccd-binning-what-does-binning-mean.
DPREVIEW, "Fujifilm announce SuperCCD SR," Digital Photography Review, Jan. 21, 2003, pp. 1-6, retrieved from https://www.dpreview.com/articles/6851251325/fujisuperccdsr.
Whetstone, J., "RGB-IR: Daytime and Nighttime Imaging From a Single Sensor," ON Semiconductor, May 12, 2017, pp. 1-3, retrieved from <http://www.onsemi.com/PowerSolutions/blog.do?method=post&param1=Daytime-and-Nighttime-Imaging-From-a-Single-Sensor>.
Faceshift, "Faceshift Studio: What is faceshift studio?," Jun. 3, 2017, pp. 1-3, as retrieved by the Internet Archive Wayback Machine, http://faceshift.com/studio/2015.2/.
Extended European Search Report issued in European Application No. 17823634.5 dated Jun. 3, 2019, 8 pages.
Office Action issued in Chinese Application No. 201780041208.X dated Sep. 2, 2019, 25 pages (With English Translation).
Office Action issued in Japanese Application No. 2019-500300 on Feb. 25, 2020, 13 pages (with English translation).

* cited by examiner

IMAGE SENSOR METHOD AND APPARATUS EQUIPPED WITH MULTIPLE CONTIGUOUS INFRARED FILTER ELEMENTS

RELATED APPLICATION(S)

The present application claims priority to a provisional application filed on Jul. 5, 2016, under Application Ser. No. 62/358,523, which is incorporated herein by reference in its entirety for all purposes.

FIELD OF THE INVENTION

The present invention relates to image sensors, and more particularly to filter array configurations for image sensors.

BACKGROUND

Typically, computer vision applications (e.g. three-dimensional depth sensing applications, etc.) require two cameras to operate. Specifically, such cameras include at least one dedicated infrared camera for generating a three-dimensional depth map, and at least one camera for capturing a color image. Further, devices such as mobile phones now more typically include at least one camera on both a front and back face of the device.

Thus, in order for such devices to support the aforementioned applications using both the front and back face camera(s), there is a requirement for a total of four (4) cameras per device (i.e. two (2) on the front face and two (2) on the back face). However, with a continuing desire to reduce a size of such devices, there is not enough space to fit such four cameras per device. Further, previous attempts to incorporate both infrared and color pixels into a single sensor fail to support other techniques (e.g. binning, etc.) that boost signal-to-noise ratio (SNR) performance.

SUMMARY

An image sensor apparatus and method are provided with multiple contiguous infrared (IR) filter elements. Included is an image sensor comprising a two-dimensional array of pixel elements that generate output signals as pixel data for representing an image of a scene. Further included is a filter array comprising a two-dimensional array of filter elements coupled to the two-dimensional array of pixel elements to receive light input from the scene. The filter array includes a plurality of blocks of filter elements each including a first subset of filter elements configured to transmit spectral energy in one or more colors of a visible spectrum of the light. Each pair of adjacent filter elements of the first subset are configured to transmit spectral energy in different colors of the visible spectrum of the light. Further, each block of filter elements also includes a second subset of filter elements configured to transmit spectral energy in an infrared (IR) spectrum of the light. The second subset of filter elements includes at least two (2) IR filter elements that are contiguous.

In a first embodiment, the image sensor may include a charge coupled device (CCD) image sensor.

In a second embodiment, the image sensor may include a complementary metal-oxide-semiconductor (CMOS) image sensor.

In a third embodiment (which may or may not be combined with the first and/or second embodiments), the second subset of filter elements may include at least four (4) IR filter elements that are contiguous.

In a fourth embodiment (which may or may not be combined with the first, second, and/or third embodiments), the first subset of filter elements may include at least two (or even all) of: red color filter elements, green color filter elements, and blue color filter elements.

In a fifth embodiment (which may or may not be combined with the first, second, third, and/or fourth embodiments), the filter array may be arranged such that a configuration of the filter elements of each block is symmetric.

In a sixth embodiment (which may or may not be combined with the first, second, third, fourth, and/or fifth embodiments), the second subset of filter elements may include a first number of filter elements that is a fraction of a second number of filter elements of the first subset of filter elements. As an option, such fraction may be one-third (⅓).

In a seventh embodiment (which may or may not be combined with the first, second, third, fourth, fifth, and/or sixth embodiments), the second subset of filter elements may be centered within each corresponding block of filter elements.

In an eighth embodiment (which may or may not be combined with the first, second, third, fourth, fifth, sixth, and/or seventh embodiments), the second subset of filter elements may be positioned at a corner of each corresponding block of filter elements In a ninth embodiment (which may or may not be combined with the first, second, third, fourth, fifth, sixth, seventh, and/or eighth embodiments), the spectral energy in the IR spectrum may be binned for at least some of the second subset of filter elements. As various options, the binning may bin voltage levels and/or charge levels. As yet another option, the spectral energy in the one or more colors of the visible spectrum may be binned for at least some of the first subset of filter elements, utilizing a first type of binning algorithm. Further, the spectral energy in the IR spectrum may be binned for at least some of the second subset of filter elements, utilizing a second type of binning algorithm. As an option, binning circuitry may be provided that bins the spectral energy in the IR spectrum of the light for at least some of the second subset of filter elements.

In a tenth embodiment (which may or may not be combined with the first, second, third, fourth, fifth, sixth, seventh, eighth, and/or ninth embodiments), a value of spectral energy in the one or more colors of the visible spectrum may be identified for at least one of the second subset of filter elements, utilizing interpolation.

In an eleventh embodiment (which may or may not be combined with the first, second, third, fourth, fifth, sixth, seventh, eighth, ninth, and/or tenth embodiments), an output associated with a first row of the filter array may be processed utilizing a higher resolution, if there are only the first subset of filter elements included in the first row. Further, an output associated with second row of the filter array may be processed utilizing a lower resolution, if there is at least one filter element of the second subset of filter elements included in the second row.

In a twelfth embodiment (which may or may not be combined with the first, second, third, fourth, fifth, sixth, seventh, eighth, ninth, tenth, and/or eleventh embodiments), at least one of the filter elements of the second subset may be larger than at least one of the filter elements of the first subset. Specifically, in one optional embodiment, at least a portion of the second subset of filter elements form a single component of the filter array that is larger than at least one of the filter elements of the first subset.

In a thirteenth embodiment (which may or may not be combined with the first, second, third, fourth, fifth, sixth, seventh, eighth, ninth, tenth, eleventh, and/or twelfth embodiments), the filter elements of the first subset may be configured in a Bayer pattern.

To this end, in some optional embodiments, one or more of the foregoing features of the aforementioned apparatus and/or method may provide a sensor that can support applications that require both IR and color imaging capabilities, in a manner that permits other performance-enhancing techniques such as binning. This is accomplished by providing a sensor with multiple contiguous IR filter elements. This may, in turn, result in a requirement for fewer cameras (and a reduction in cost and/or form factor) that would otherwise be foregone in devices that lack such feature, and, particularly, in devices with camera systems on both front and back faces of such devices. It should be noted that the aforementioned potential advantages are set forth for illustrative purposes only and should not be construed as limiting in any manner.

BRIEF DESCRIPTION OF THE DRAWINGS

FIG. 1A-2 illustrates an example of binning, in accordance with one embodiment.

FIG. 1B illustrates a filter array equipped with multiple contiguous infrared (IR) filter elements, in accordance with one embodiment.

FIG. 1C illustrates yet another filter array equipped with multiple contiguous IR filter elements that are surrounded by red color filter elements and green color filter elements, in accordance with yet another embodiment.

FIG. 2 illustrates another filter array equipped with multiple contiguous IR filter elements that are positioned at a corner of each filter element group including red color filter elements, green color filter elements, and blue color filter elements positioned in an alternating manner, in accordance with another embodiment.

DETAILED DESCRIPTION

Various embodiments are described involving a single sensor that can support applications that require both infrared (IR) and color imaging capabilities, in a manner that permits other performance-enhancing techniques such as binning. This is accomplished by providing a single sensor with multiple contiguous IR filter elements. This may, in turn, result in a requirement for fewer cameras (and a reduction in cost and/or form factor) that would otherwise be foregone in devices that lack such feature, and, particularly, in devices with camera systems on both front and back faces of such devices. It should be noted that the aforementioned potential advantages are set forth for illustrative purposes only and should not be construed as limiting in any manner. With that said, various embodiments will now be described in connection with subsequent figures.

Figures 1, 1A:
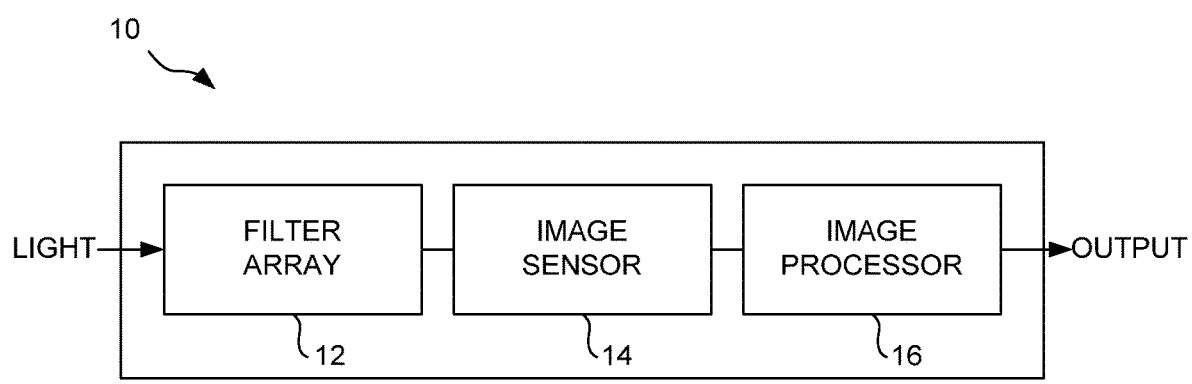
FIG. 1A-1 is a circuit diagram of an image sensor apparatus, in accordance with one embodiment.

FIG. 1A-1 is a circuit diagram of an image sensor apparatus 10, in accordance with one embodiment. In such embodiment, the image sensor apparatus 10 may be a component of a single camera that is capable of generating color- and IR-related output signals. To accomplish this, the image sensor apparatus 10 may include a single filter array 12 which, in the context of the present description, may include any set of filter elements (i.e. filter array portions, etc.) configured to transmit spectral energy of various spectrums. In one embodiment, the filter array 12 may include a two-dimensional array (which may comprise two or more dimensions) that includes a plurality of color filter elements and a plurality of IR filter elements. In various embodiments, the color filter elements and the IR filter elements may be positioned and/or configured in any desired manner insofar as multiple IR filter elements are contiguous (e.g. each IR filter element arranged with at least one adjacent, adjoining or neighboring IR filter element), for reasons that will soon become apparent.

Also included is a single image sensor 14 comprising a two-dimensional array of pixel elements (or sensor elements). In one embodiment, the single image sensor 14 may include a charge coupled device (CCD) image sensor. In other embodiment, the single image sensor 14 may include a complementary metal-oxide-semiconductor (CMOS) image sensor. In various embodiments, the CCD image sensor may provide optional performance benefits (e.g. larger SNR, etc.), as compared to the CMOS image sensor. In other embodiments, other enabling technologies are contemplated, as well. In use, such single image sensor 14 is configured to generate output signals at each pixel element as pixel data representing an image of a scene (that is captured through the reflection of light that is received by the image sensor apparatus 10).

The filter array 12 is coupled to the two-dimensional array of pixel elements of the image sensor 14, for selectively transmitting (e.g. filtering, etc.) spectral energy prior to the image sensor 14 generating its output signals. As an option, such output signals from the image sensor 14 may be processed by an image circuitry 16 for performing various techniques (e.g. binning, interpolation, etc.) on the output signals from the image sensor 14. Circuitry 16 may include hardware logics supporting binning mechanism and/or one or more processors. More information will now be set forth regarding one particular method for carrying out binning using the image sensor apparatus 10, in accordance with one embodiment.

Figures 1, 1A, 2:
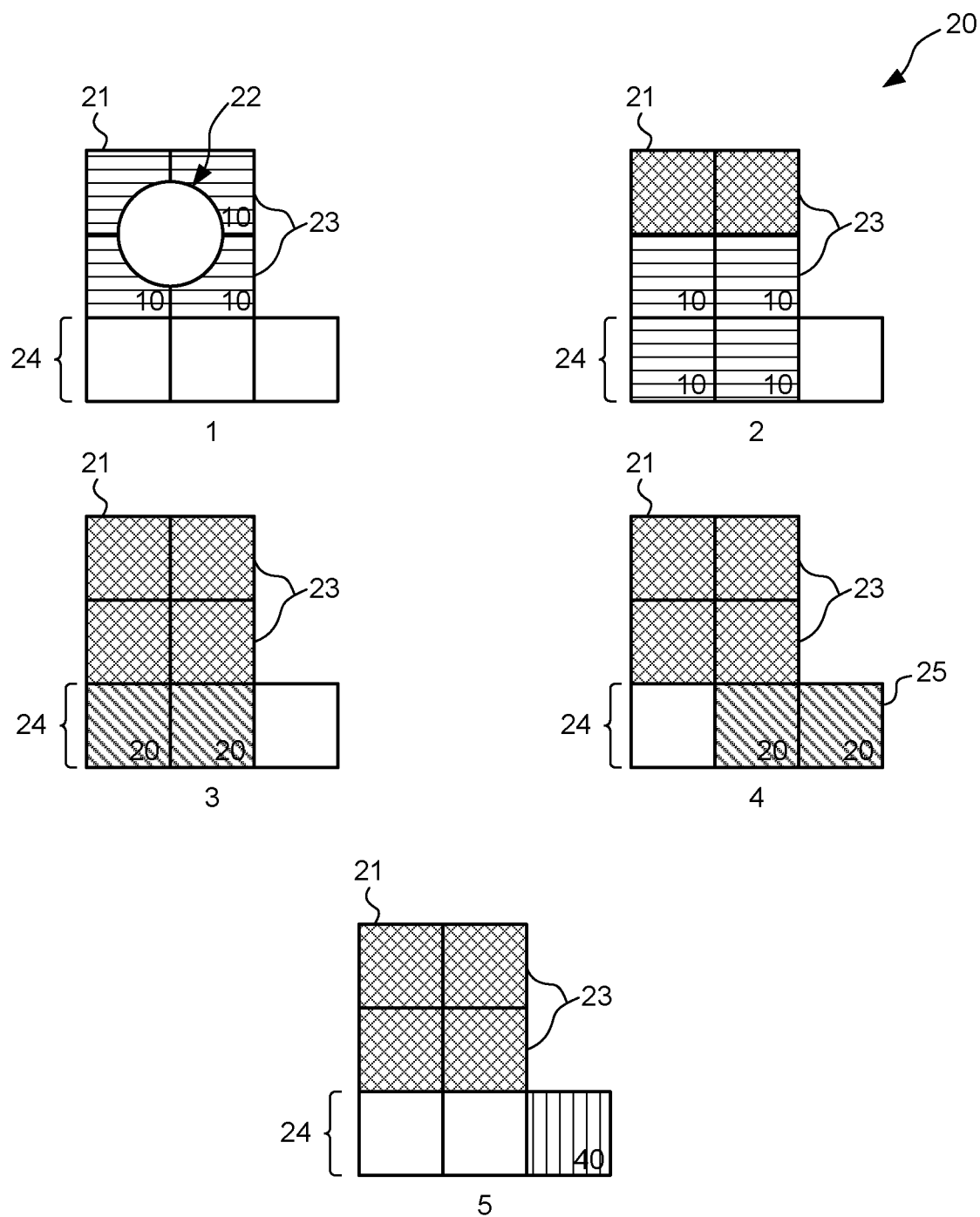
Figure 2:
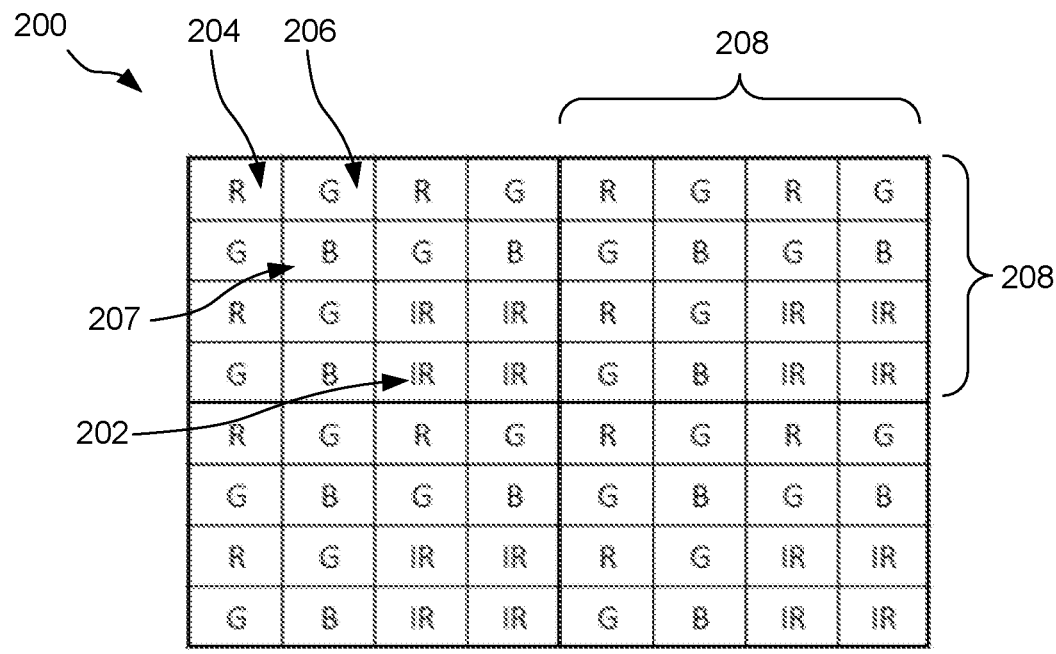

FIG. 1A-2 illustrates an example of binning 20, in accordance with one embodiment. In general, the binning 20 involves a combining of information of adjacent sensor elements 23 of an image sensor 21 (e.g. image sensor 14 of FIG. 1A-1) to create a single pixel in a recorded image. Thus, in the context of the present description, such binning 20 may include any algorithm whereby an output or content of a first one of the filter elements 23 is combined, aggregated, etc. (at least in part) with an output or content of a second one of the filter elements 23.

As shown in FIG. 1A-2, the binning 20 may involve an illuminated area 22 that spans four of the sensor elements 23 of the image sensor 21. The image sensor 21 is further shown to be equipped with an output register 24 which may be part of the image sensor 21 and/or an image circuitry (e.g. image circuitry 16 of FIG. 1A-1).

As indicated in operation 1, a light signal that is directed at the illuminated area 22 induces a charge of 10 electrons in each of the four sensor elements 23. In operation 2, the aforementioned charge is shifted (e.g. clocked) into the output register 24. In operation 3, the aforementioned charge is shifted again (e.g. via another clock) and the charge from a first row of the image sensor 21 is added to a first row of the output register 24. Next, in operation 4, the summed charge from the two right sensor elements 23 is shifted (e.g. by an additional clock) to produce an output 25. Finally, in operation 5, contents of the output register 24 are shifted (or clocked) again to sum the charge from all of the sensor elements 23 in the output register 24, thereby producing a final version of the output 25. As such, outputs of at least two adjacent sensor elements are combined via the binning mechanism. A hardware-based binning mechanism may be advantageously performed to reduce pixel (or sensor element) read-out noise (e.g. only one summed result 25 is read out instead of reading out from each of pixel elements 23).

By this design, fewer steps are required for achieving the output 25, by virtue of the fact that the charges at the sensor elements 23 are combined in the forgoing manner. With that said, in the context of more complex image sensors that include both color and IR elements that are arranged in alternating order (i.e. a color element next to an IR element next to a color element, and so forth), such binning 20 may be complicated by virtue of the fact that an output of the IR and color elements should not necessarily be combined (as would happen with the binning 20). To this end, as will now be elaborated upon, the foregoing binning 20 may be further supported by providing image sensors with continuous IR elements that accommodate the foregoing operations 1-5 of the aforementioned binning 20.

Figures 1B, 1C:
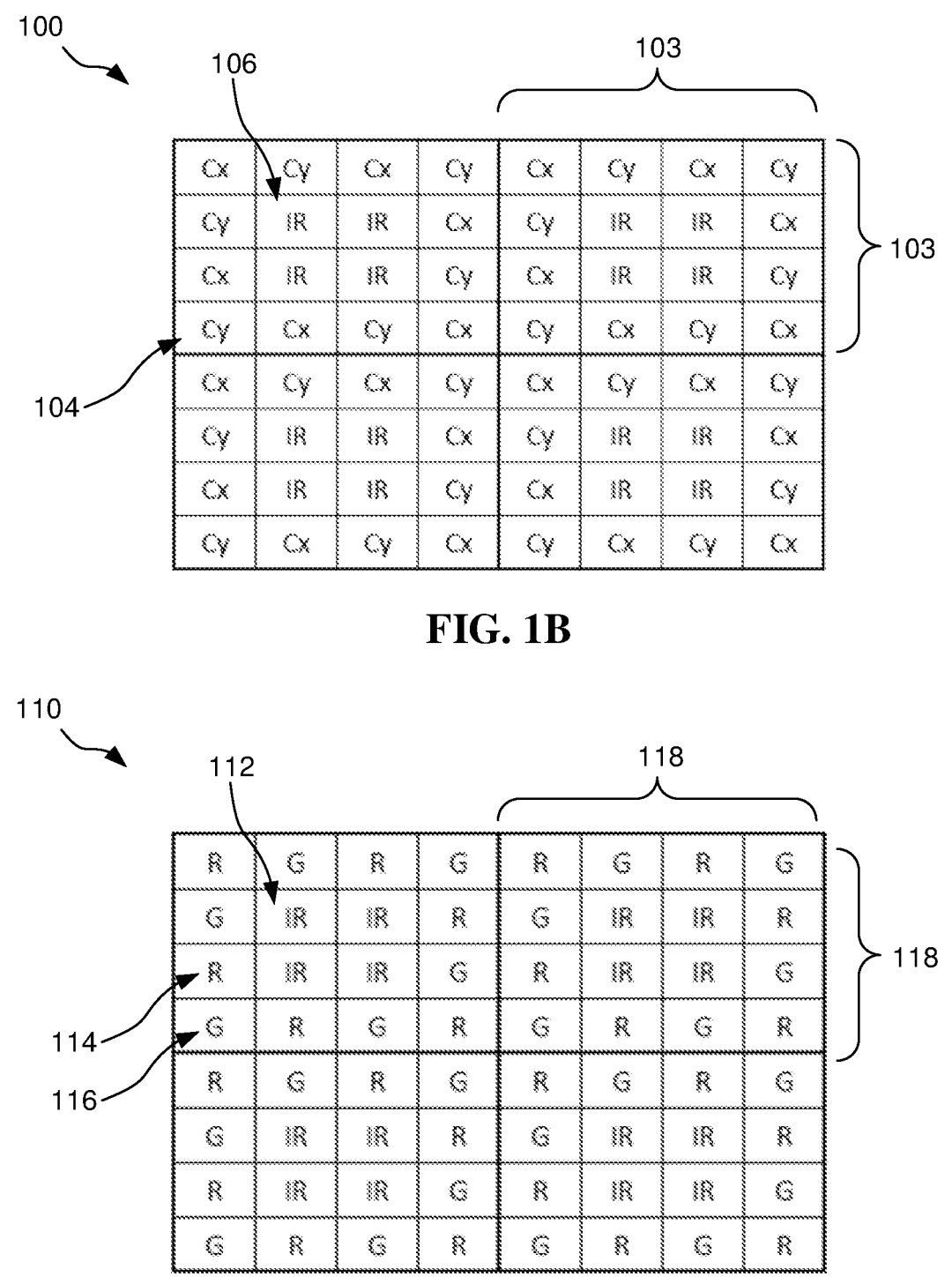

FIG. 1B illustrates a filter array 100 equipped with multiple contiguous IR filter elements, in accordance with one embodiment. As will be subsequently described in various embodiments, the filter array 100 may be configured to cooperate with a single image sensor for generating outputting signals.

As shown, the filter array 100 includes a plurality of filter element groups 103 that may each form a "block" of the filter elements. While the filter element groups are shown to each include a 2×2 matrix of filter elements, it should be noted that any N-by-N matrix of filter elements is contemplated, where N=2, 3, 5, 6 . . . or any integer, for that matter. As further shown, a plurality of the filter element groups 103 may be included to form the filter array 100. While a 2×2 matrix of filter element groups 103 are shown in FIG. 1B, it should be noted that any M-by-M matrix of filter element groups 103 is contemplated, where M=2, 3, 5, 6 . . . or any integer, for that matter. As an option, the filter array 100 may be arranged such that a configuration of the filter elements of each filter element group 103 may be symmetric. In other words, each of the filter element groups 103 may include the same or substantially the same arrangement of filter elements.

Each filter element group 103 is shown to include a first subset of filter elements 104 (hereinafter "color filter elements" 104) configured to transmit spectral energy in one or more colors of a visible spectrum of an incoming light (while filtering out other portions of the light). As will become apparent during the subsequent description of various embodiments, the color filter elements 104 may include at least two (or even all) of: red color filter elements, green color filter elements, and/or blue color filter elements. It should be noted, however, that such red/greed/blue (RGB) embodiment is set forth for illustrative purposes only, as other color schemes [e.g. cyan/magenta/yellow/black (CMYK), etc.] are contemplated, as well.

Further, all color filter elements 104 that are contiguous (or two adjoining color filter elements in the two dimensional filter array 100) are configured to transmit spectral energy in different colors of the visible spectrum. In the context of the present description, two filter elements may be contiguous if such two filter elements share at least one border thereof, such that a first border of a first filter element abuts a second border of a second filter element. For example, in one possible embodiment that will be described later in greater detail, the color filter elements 104 may be configured in a Bayer pattern. A Bayer pattern refers to a specific mosaic for arranging RGB color filters in a square grid. The Bayer pattern includes 50% green filter elements, 25% red filter elements, and 25% blue filter elements. An example of such Bayer pattern will be described later in connection with another embodiment shown in FIG. 2.

Further included is a second subset of filter elements 106 (hereinafter "IR filter elements" 106) configured to transmit spectral energy in an IR spectrum (e.g. of an invisible portion of an incoming light) that can occur naturally in the environment as a result of sunlight or other artificial sources. IR filter elements 106 may filter out portions of the incoming light other than the IR spectrum. In the context of the present description, such IR spectrum may be inclusive of both IR and/or near-IR spectrums. Still yet, in one embodiment, the IR filter elements 106 may serve to create a three-dimensional (3-D) depth map including depth information that may be utilized in connection with various applications. Such depth information relates to a distance of surfaces of one or more scene objects from a particular viewpoint, and may be used in connection with a depth buffer, i.e. Z-buffer in different graphics applications.

In different embodiments, the IR filter elements 106 may include a first number of filter elements that is a fraction of a second number of the color filter elements 104. In the embodiment shown in FIG. 1B, such fraction may be one-third (⅓). In other embodiments, however, the foregoing fraction may include any fraction 1/Q, where Q=2, 4, 5, 6 . . . or any integer, for that matter.

Further, the color filter elements 104 and the IR filter elements 106 may be of any respective size and may be combined (e.g. in terms of silicon area, componentry, filter array space, etc.) in any desired manner. For example, in one embodiment, the color filter elements 104 and the IR filter elements 106 may be uniform in size. However, in other possible embodiments that will be described later, at least one of the IR filter elements 106 may take a form that is larger than that of at least one of the color filter elements 104. For example, in one possible embodiment, multiple IR filter elements 106 (which may constitute a portion or all of the elements 106) may collectively form a single component (e.g. area, part, etc.) of the filter array 100 that is larger than at least one of the color filter elements 104. In such embodiment, any portion(s)/aspect(s) (e.g. componentry, silicon area, filter array space, etc.) of the IR filter elements 106 may be aggregated, shared, and/or combined to afford such larger form.

With continuing reference to FIG. 1B, the IR filter elements 106 are contiguous. While four (4) of the IR filter elements 106 are shown in FIG. 1B, it should be noted that any plural number P of the IR filter elements 106 may be contiguous, where P=2, 3, 5, 6 . . . or any integer greater than 1, for that matter. It should also be noted that embodiments are contemplated where all of the IR filter elements 106 are contiguous in each filter element group 103. Further, other embodiments are contemplated where only some of the IR filter elements 106 are contiguous in each filter element group 103.

In different embodiments, the IR filter elements 106 and, more particularly, the contiguous IR filter elements 106 may be positioned at any location within each of the filter element groups 103. For example, as shown in the embodiment of FIG. 1B, the IR filter elements 106 may be centered within the color filter elements 104 (of each filter element group 103). In other embodiments that will be described in the context of subsequent figures, the IR filter elements 106 may be positioned at any location with respect to the color filter elements 104 within each of the filter element groups 103 including, but not limited to at a corner of each of the filter element groups 103. Strictly as an option, a value of spectral energy in the one or more colors of the visible spectrum may be identified utilizing interpolation, in connection with any area where one or more color filter element(s) 104 is supplanted by one or more IR filter element(s) 106.

To this end, in some optional embodiments, the foregoing contiguousness enables the manufacture and use of a single camera that can support applications that require both IR and color imaging capabilities, in a manner that permits other performance-enhancing techniques such as binning. This is accomplished by providing a single sensor with multiple contiguous IR filter elements. As mentioned earlier in connection with FIG. 1A-2, binning involves the combining of output signals from adjacent elements of a like kind (e.g. color vs. IR). To this end, by ensuring that, for example, IR elements are at least partially contiguous, binning may be performed on such adjacent elements, which would otherwise be impossible (or at least less practical, effective, and/or efficient, etc.) with configurations where un-combinable elements are next to each other (i.e. a color element is next to an IR element which is next to a color element, and so forth)

Such contiguousness may thus, in turn, result in a requirement for fewer cameras (and a reduction in cost and/or form factor) that would otherwise be foregone in devices that lack such feature, and, particularly, in devices with camera systems on both front and back faces of such devices. It should be noted that the aforementioned potential advantages are set forth for illustrative purposes only and, thus, are strictly optional. More illustrative information will now be set forth regarding various optional architectures and uses in which the foregoing method may or may not be implemented, per the desires of the user. Any of the following features may be optionally incorporated with or without the exclusion of other features described.

FIG. 1C illustrates yet another filter array 110 equipped with multiple contiguous IR filter elements 112 that are surrounded by red color filter elements 114 and green color filter elements 116, in accordance with yet another embodiment. As shown, the contiguous IR filter elements 112 form a 2×2 matrix that is centered within the red color filter elements 114 and the green color filter elements 116. Further, the red color filter elements 114 and the green color filter elements 116 are positioned in an alternating fashion along each border of each filter element group 118, in the manner shown.

FIG. 2 illustrates another filter array 200 equipped with multiple contiguous IR filter elements 202 that are positioned at a corner of each filter element group 208 including red color filter elements 204, green color filter elements 206, and blue color filter elements 207 positioned in an alternating manner, in accordance with another embodiment. As shown, the contiguous IR filter elements 202 form a 2×2 matrix that is positioned at a lower right hand corner of each filter element group 208.

It should be noted that other embodiments are contemplated where the contiguous IR filter elements 202 are positioned at other corners (e.g. upper right hand, lower left hand, upper left hand, etc.) corner. Further, while the contiguous IR filter elements 202 reside along (e.g. are contiguous with) borders of each filter element group 208, other embodiments are contemplated where the contiguous IR filter elements 202 are spaced from such borders. It should also be noted that the above variations may apply to any of the embodiments described herein in the context of both previous and/or subsequent figures and, thus, will be not be repeated.

As further shown, a first and third row of each filter element group 208 include the red color filter elements 204 and the green color filter elements 206 each positioned in an alternating fashion. A second and fourth row of each filter element group 208 include the blue color filter elements 207 and the green color filter elements 206 each positioned in an alternating fashion. To this end, the red color filter elements 204, the green color filter elements 206, and the blue color filter elements 207 are configured in a Bayer pattern, in the manner shown.

Figure 3:
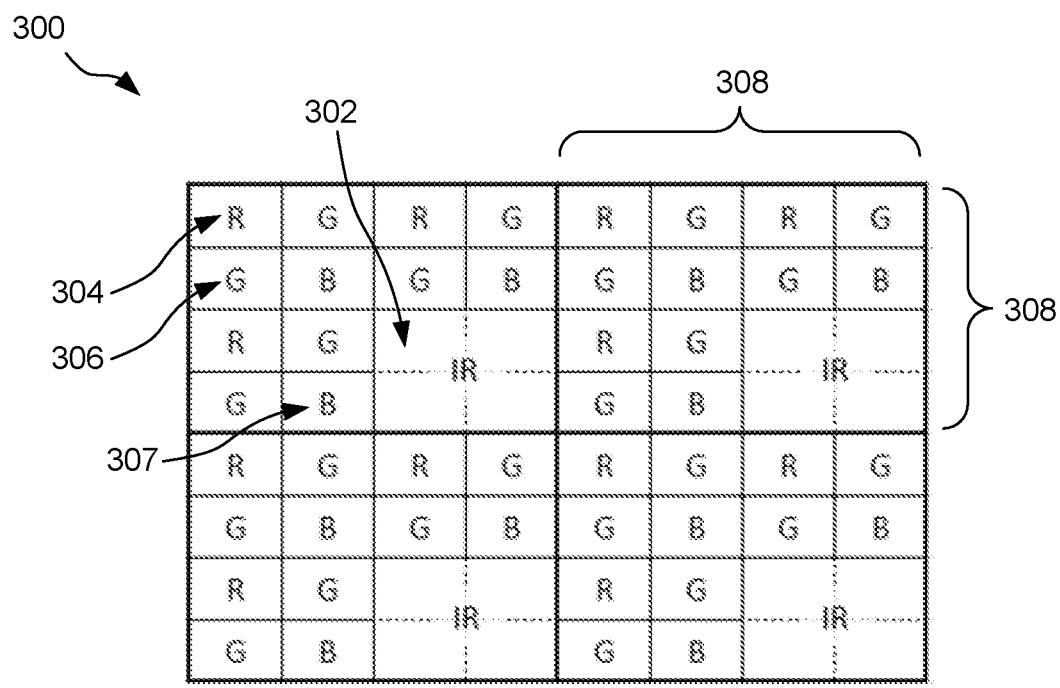
FIG. 3 illustrates still yet another filter array equipped with multiple contiguous IR filter elements in the form of a large single pixel that is positioned at a corner of each filter element group including red color filter elements, green color filter elements, and blue color filter elements positioned in alternating manner, in accordance with still yet another embodiment.

FIG. 3 illustrates still yet another filter array 300 equipped with multiple contiguous IR filter elements 302 in the form of a large single pixel that is positioned at a corner of each filter element group 308 including red color filter elements 304, green color filter elements 306, and blue color filter elements 307 positioned in alternating manner, in accordance with still yet another embodiment. As mentioned earlier, any portion(s)/aspect(s) (e.g. componentry, silicon area, filter array space, etc.) of the IR filter elements 302 may be aggregated, shared, and/or combined to provide such larger form.

In one exemplary embodiment, the contiguous IR filter elements 302 in each filter element group 308 form a single pixel that is larger (e.g. 2.24 um, etc.) than a size (e.g. 1.12 um, etc.) of pixels of the red color filter elements 304, the green color filter elements 306, and the blue color filter elements 307. As further shown, a first and third row of each filter element group 308 include the red color filter elements 304 and the green color filter elements 308 each positioned in an alternating fashion. A second and fourth row of each filter element group 308 include the blue color filter elements 307 and the green color filter elements 306 each positioned in an alternating fashion. As will be described later during the description of subsequent embodiments, processing of rows including such different pixel sizes may be modified to accommodate such design (e.g. by processing the different elements of the different rows differently, etc.).

Figure 4:
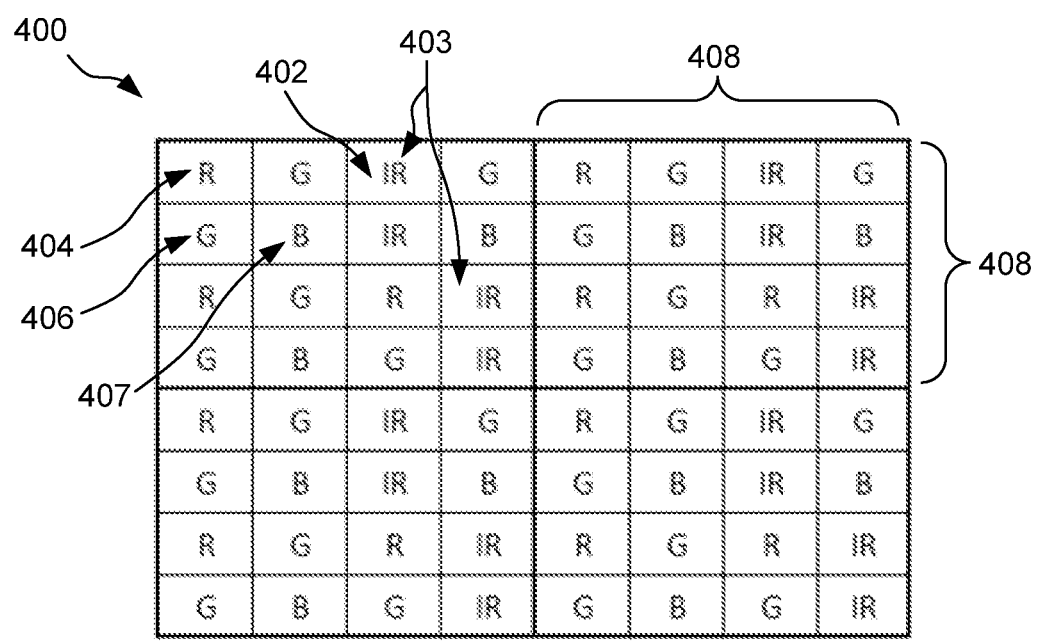
FIG. 4 illustrates even still yet another filter array equipped with multiple contiguous IR filter elements that are configured as multiple separate contiguous IR filter element sets, in accordance with even still yet another embodiment.

FIG. 4 illustrates even still yet another filter array 400 equipped with multiple contiguous IR filter elements 402 that are configured as multiple separate 1×2 contiguous IR filter element sets 403, in accordance with even still yet another embodiment. While they may be positioned in any relative location in each filter element group 408, the contiguous IR filter element sets 403 are, in the present embodiment, positioned on a right hand side of each filter element group 408 and are spaced/offset, in the manner shown, so as to not share any border.

Further, each filter element group 408 includes red color filter elements 404, green color filter elements 406, and blue color filter elements 407 positioned in an alternating manner. Specifically, a first and third row of each filter element group 408 include the red color filter elements 404 and the green color filter elements 406 each positioned in an alternating fashion. A second and fourth row of each filter element group 408 include the blue color filter elements 407 and the green color filter elements 406 each positioned in an alternating fashion.

Figure 5:
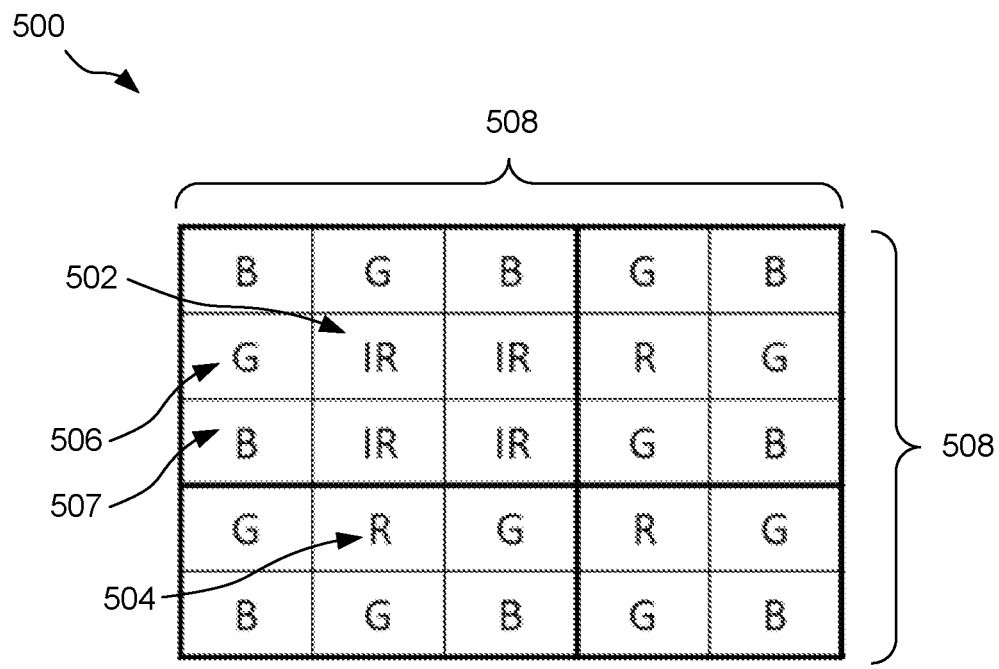
FIG. 5 illustrates a filter array equipped with multiple contiguous IR filter elements that are positioned in larger 5×5 filter element groups including red color filter elements, green color filter elements, and blue color filter elements, in accordance with one embodiment.

FIG. 5 illustrates a filter array 500 equipped with multiple contiguous IR filter elements 502 that are positioned in larger 5×5 filter element groups 508 including red color filter elements 504, green color filter elements 506, and blue color filter elements 507, in accordance with one embodiment. As shown, each filter element group 508 is augmented to include a 5×5 matrix of filter elements, while the contiguous IR filter elements 502 form a 2×2 matrix that is positioned in a manner that is spaced from all borders of each filter element group 508, yet offset from a center (towards an upper left hand corner) of the filter element group 508, in the manner shown.

As further shown, a first, third, and fifth row of each filter element group 508 include the blue color filter elements 507 and the green color filter elements 506 each positioned in an alternating fashion. Further, a second and fourth row of each filter element group 508 include the red color filter elements 504 and the green color filter elements 506 each positioned in an alternating fashion.

Figure 6:
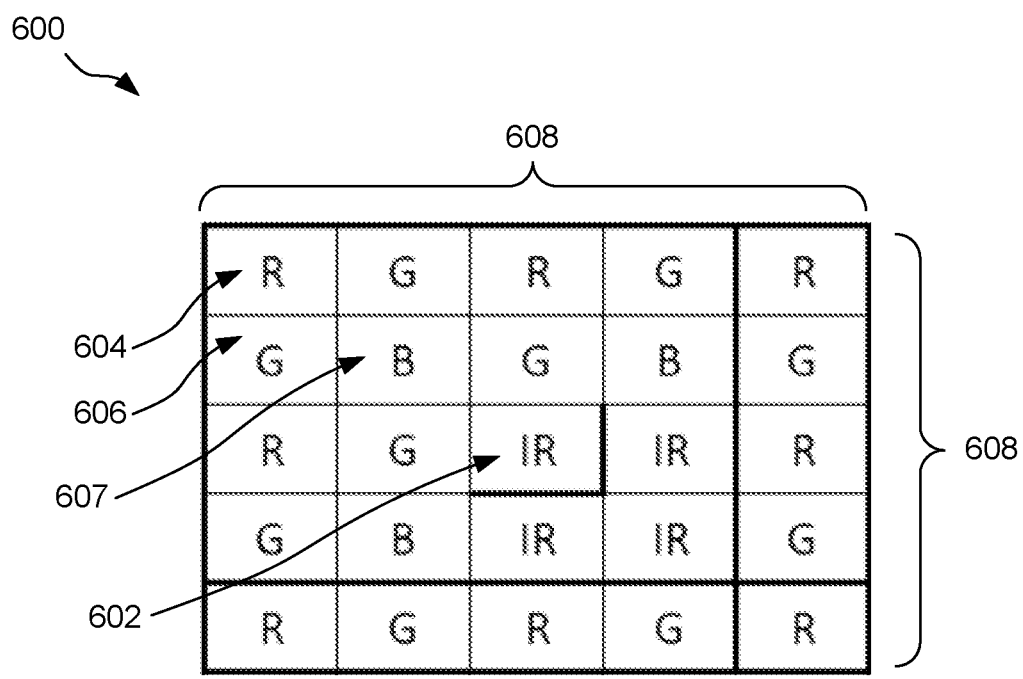
FIG. 6 illustrates another filter array equipped with multiple contiguous IR filter elements that are positioned in larger 5×5 filter element groups including red color filter elements, green color filter elements, and blue color filter elements, in accordance with another embodiment.

FIG. 6 illustrates another filter array 600 equipped with multiple contiguous IR filter elements 602 that are positioned in larger 5×5 filter element groups 608 including red color filter elements 604, green color filter elements 606, and blue color filter elements 607, in accordance with another embodiment. As shown, each filter element group 608 is augmented to include a 5×5 matrix of filter elements, while the contiguous IR filter elements 602 form a 2×2 matrix that is positioned in a manner that is spaced from all borders of each filter element group 608, yet offset from a center (towards a lower right hand corner) of the filter element group 608, in the manner shown.

As further shown, a first, third, and fifth row of each filter element group 608 include the red color filter elements 604 and the green color filter elements 606 each positioned in an alternating fashion. Further, a second and fourth row of each filter element group 608 include the blue color filter elements 607 and the green color filter elements 606 each positioned in an alternating fashion.

Figure 7:
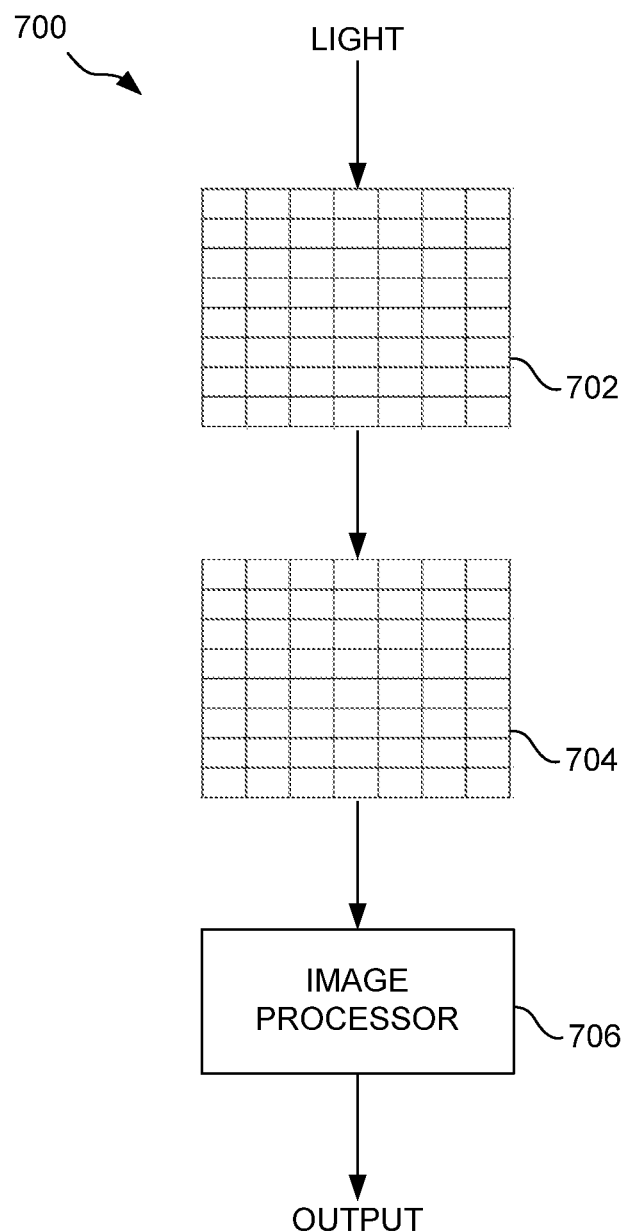
FIG. 7 is an exploded view of an image sensor apparatus, in accordance with one embodiment.

FIG. 7 is an exploded view of an image sensor apparatus 700, in accordance with one embodiment. As an option, the apparatus 700 may be implemented in the context of any one or more of the embodiments set forth in any previous and/or subsequent figure(s) and/or description thereof. For example, any of the filter arrays of FIGS. 1-6 may be implemented in the context of the image sensor apparatus 700 of FIG. 7. However, it is to be appreciated that the apparatus 700 may be implemented in the context of any desired environment.

In one embodiment, the image sensor apparatus 700 may be a component of a single camera that is capable of generating color- and IR-related output signals. To accomplish this, the image sensor apparatus 700 includes a single filter array means in the form of a single filter array 702 including a two-dimensional array that includes a plurality of color filter elements and a plurality of IR filter elements. In one embodiment, the single filter array 702 may include the filter array 12 of FIG. 1A-1. In various embodiments, the color filter elements and the IR filter elements may be positioned and/or configured in any desired manner (e.g. see FIGS. 1-6, etc.) insofar as multiple IR filter elements are contiguous.

Also included is a single image sensor means in the form of a single image sensor 704 comprising a two-dimensional array of pixel elements. In one embodiment, the single image sensor 704 may include the image sensor 14 of FIG. 1A-1. In use, such single image sensor 704 is configured to generate output signals at each pixel element as pixel data representing an image of a scene (that is captured through the reflection of light that is received by the image sensor apparatus 700).

The filter array 702 is coupled to the two-dimensional array of pixel elements of the image sensor 704, for selectively transmitting (e.g. filtering, etc.) spectral energy prior to the image sensor 704 generating its output signals. As an option, such output signals from the image sensor 704 may be processed by an image processor 706 for performing various techniques (e.g. binning, interpolation, etc.) on the output signals from the image sensor 704. More information will now be set forth regarding one particular method for processing output signals from the image sensor 704, in accordance with one embodiment.

Figure 8A:
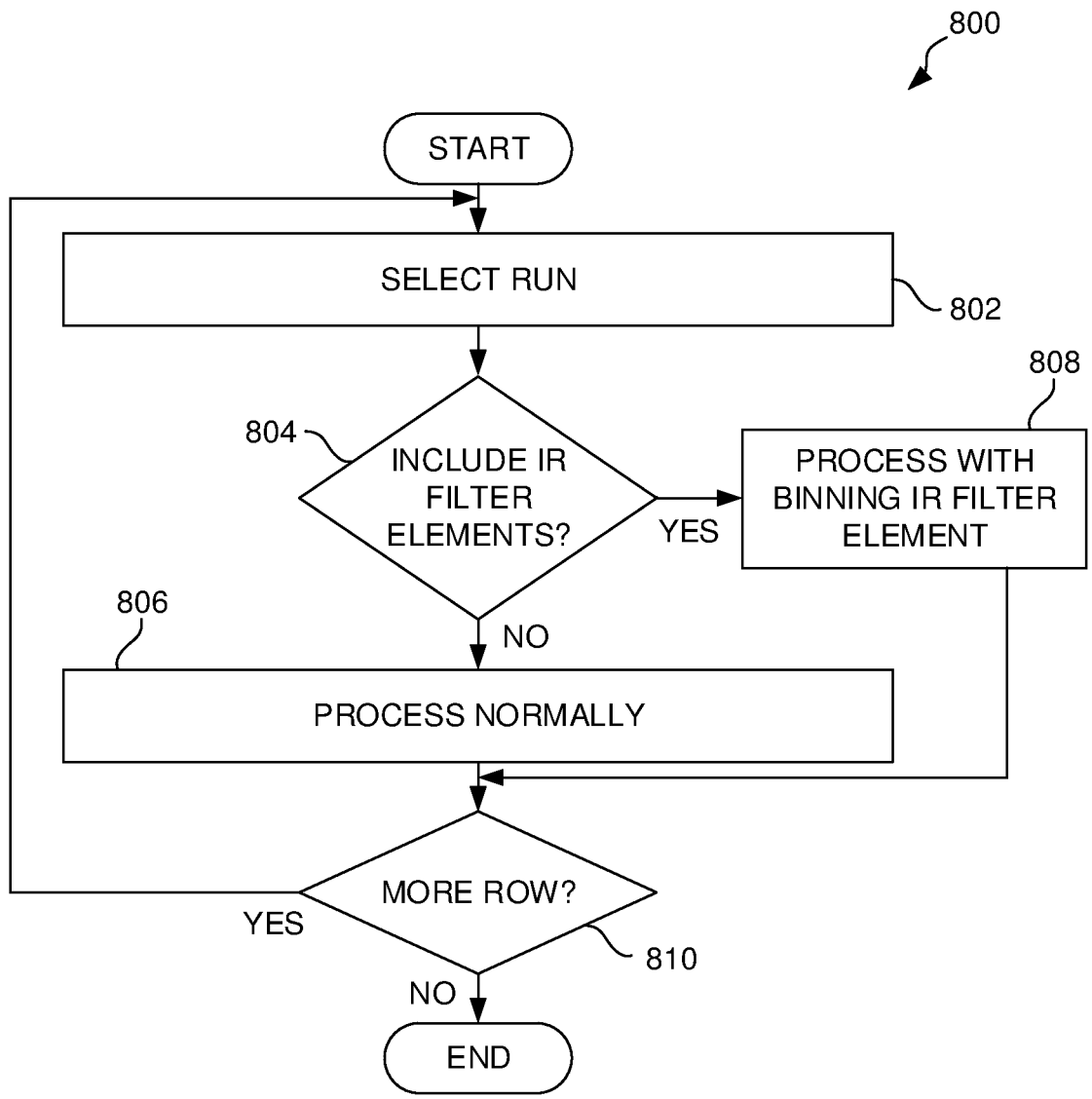
FIG. 8A illustrates a method for processing output signals from an image sensor, in accordance with one embodiment.

FIG. 8A illustrates a method 800 for processing output signals from an image sensor, in accordance with one embodiment. As an option, the method 800 may be implemented in the context of any one or more of the embodiments set forth in any previous and/or subsequent figure(s) and/or description thereof. For example, the method 800 may be implemented in the context of the image sensor apparatus 700 of FIG. 7 and, in particular, may be carried out by the image processor 706 thereof. However, it is to be appreciated that the method 800 may be implemented in the context of any desired environment.

As shown, the method 800 processes an output of each of the pixel elements of an image sensor (e.g. image sensor 704 of FIG. 7, etc.) where such output is a function of light that is received by the image sensor, after being filtered by a filter array (e.g. filter array 702 of FIG. 7, etc.) coupled to the image sensor. In the illustrated embodiment, such processing proceeds on a row-by-row basis among the rows of the two-dimensional array of pixel elements of the image sensor. This is accomplished, for example, by first selecting a particular row (e.g. starting with a first row) in operation 802, and then determining whether the present row includes IR filter elements. See decision 804.

As mentioned earlier, the filter array may take on any configuration (e.g. see FIGS. 1-6, etc.) and, thus, some rows will not necessarily include IR filter elements. In such case, the color image data is processed normally, per operation 806. It should be noted that, in various embodiments, the normal processing of operation 806 may or may not include any of the techniques to be described below with respect to the IR filter elements.

On the other hand, if it is determined that the present row does indeed include one or more IR filter elements per decision 804, such IR filter elements may be processed using additional techniques. See operation 808. For example, the spectral energy in the IR spectrum may be binned for at least some (or even each) of the IR filter elements.

Further, the contiguousness of the IR filter elements enable such binning, which would be impossible (or at least less practical, effective, and/or efficient, etc.) absent such design configuration, since hardware/software that carry out such binning algorithms is typically configured to process adjacent elements, one-by-one, in the order that they are positioned (e.g. using shift registers or other mechanisms). Specifically, as mentioned earlier in connection with FIG. 1A-2, binning involves the combining of output signals from adjacent elements of a like kind (e.g. color vs. IR). To this end, by ensuring that, for example, IR elements are at least partially contiguous, binning may be performed on such adjacent elements, which would otherwise be impossible (or at least less practical, effective, and/or efficient, etc.) with configurations where un-combinable elements are next to each other (i.e. a color element is next to an IR element which is next to a color element, and so forth). While contiguous filter elements may facilitate binning in such manner, it should be noted that other types of binning algorithms are contemplated where binning occurs across filter elements that are not contiguous.

As various options, the binning may bin voltage levels and/or charge levels exhibited by the various filter elements (e.g. color filter elements, IR filter elements). In the case of voltage level binning, such binning may aggregate a level of voltages at an output of any post-processing circuitry that processes charge levels of IR or color filter elements of the image sensor. On the other hand, in the case of charge level binning, such binning may aggregate a level of charges actually stored by the IR or color filter elements of the image sensor, prior to any post-processing circuitry that processes such charge levels.

In one possible embodiment, the foregoing binning may be carried out for the color filter elements, as well as the IR filter elements. Further, the spectral energy in the one or more colors of the visible spectrum may be binned for at least some (or even each) color filter element, utilizing a first type of binning algorithm; while the spectral energy in the IR spectrum may be binned for at least some (or even each) of the IR filter elements, utilizing a second type of binning algorithm. In various embodiments, such differing types of binning algorithms may include any binning algorithm that accommodates the different relative positioning, configuration, general nature, etc. of the color filter elements versus the IR filter elements.

In one optional embodiment, the processing of a row with at least one IR filter element may be modified (during the processing of such row) to accommodate any color filter elements in the same row. For example, in one embodiment, the charge/voltage collection may be performed on a per-filter element basis, so that such charge/voltage collection is not mixed when addressing an IR filter element versus a color filter element. In other embodiments, the color filter elements may simply be ignored (such that there is no color-related charge/voltage collection) for a row that includes at least one IR filter element. In still yet another embodiment, the elements may be treated all the same (in terms of charge/voltage collection) regardless as to whether they are color- or IR-related, for a row that includes at least one IR filter element. In such embodiment, various filtering techniques may or may not be used to distinguish the color- or IR-related filter element charge/voltage collection. As another option, interpolation techniques may be used to identify color- or IR-related filter element values, using values from other rows of the array.

As a further option, the processing of operations 806 and 808 may differ with respect to a resolution in which the filter elements are processed and such different processing may be driven by an existence any IR filter element(s) in a particular row to be processed. In the context of the present description, such resolution-specific processing may refer to a number of filter elements that are processed at once. Just by way of example, a higher resolution processing may process each filter element individually, while a lower resolution processing may process multiple filter elements simultaneously. Thus, in one embodiment, an output associated with (e.g. derived from/in connection with, etc.) a first row of the filter array may be processed utilizing a higher resolution, if there are only color filter elements included in the first row. Further, an output associated with a second row of the filter array may be processed utilizing a lower resolution, if at least one IR filter element is included in the second row.

In still additional embodiments, a frame rate [e.g. frames per second (fps), etc.] may also be altered on a row-by-row basis, based on an existence (or non-existence) of one or more IR filter elements in such row. For example, the frame rate may be increased for rows with IR filter elements sufficiently, so as to avoid a need for a global shutter. For example, in one embodiment with 120 fps, 30 fps may be dedicated to color imaging, while 90 fps may be dedicated to IR imaging.

Thus, various embodiments are contemplated where a resolution of color imaging may be mildly or negligibly degraded, while allowing the same single camera to provide depth maps of sufficient resolution. Further, such color imaging degradation may be compensated using other techniques (e.g. interpolation, etc.).

Figure 8B:
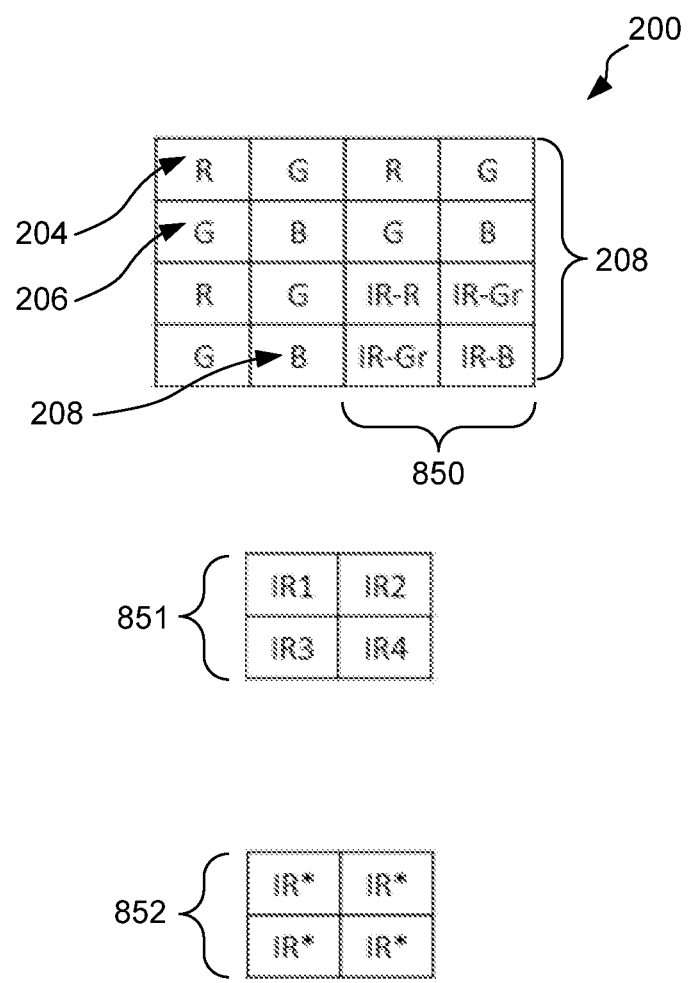
FIG. 8B illustrates an example of processing the particular configuration of the filter array of FIG. 2, in accordance with one embodiment.

FIG. 8B illustrates an example of processing the particular configuration of the filter array 200 of FIG. 2, in accordance with one embodiment. A recovered pre-Bayer pattern color RGB image is shown. Specifically, color values 850 of one particular filter element group 208 are illustrated that would have otherwise been generated using color filter elements, but for the replacement thereof with the contiguous IR filter elements 202. Such color values 850 are calculated via interpolation, using the color values generated from the respective adjacent red color filter elements 204, green color filter elements 206, and blue color filter elements 207.

Due to the specific Bayer pattern, potential advantages in spatial resolution (higher sampling rate) may be afforded in a manner that is less prone to color artifacts. Further, the contiguous IR filter elements 202, namely elements IR1, IR2, IR3, IR4 851 may be binned (e.g. the corresponding values added: IR1+IR2+IR3+IR4=IR*, etc.) to afford an extracted IR binned image 852, as shown. In the context of an embodiment where the filter element group 208 is one of 16 (in a 4×4 group matrix), such extracted IR binned image 852 may exhibit a higher SNR. Assuming a 12 MB image sensor in a 2×2 binning mode, a 0.75 MP depth map (with high sensitivity, 2.0 um effectiveness) may be provided, which exceeds normal depth map resolutions (e.g. 0.3 MP, etc.). Given this, image processing may proceed using a Bayer demosaic algorithms for providing a full resolution color RGB image.

Figure 9:
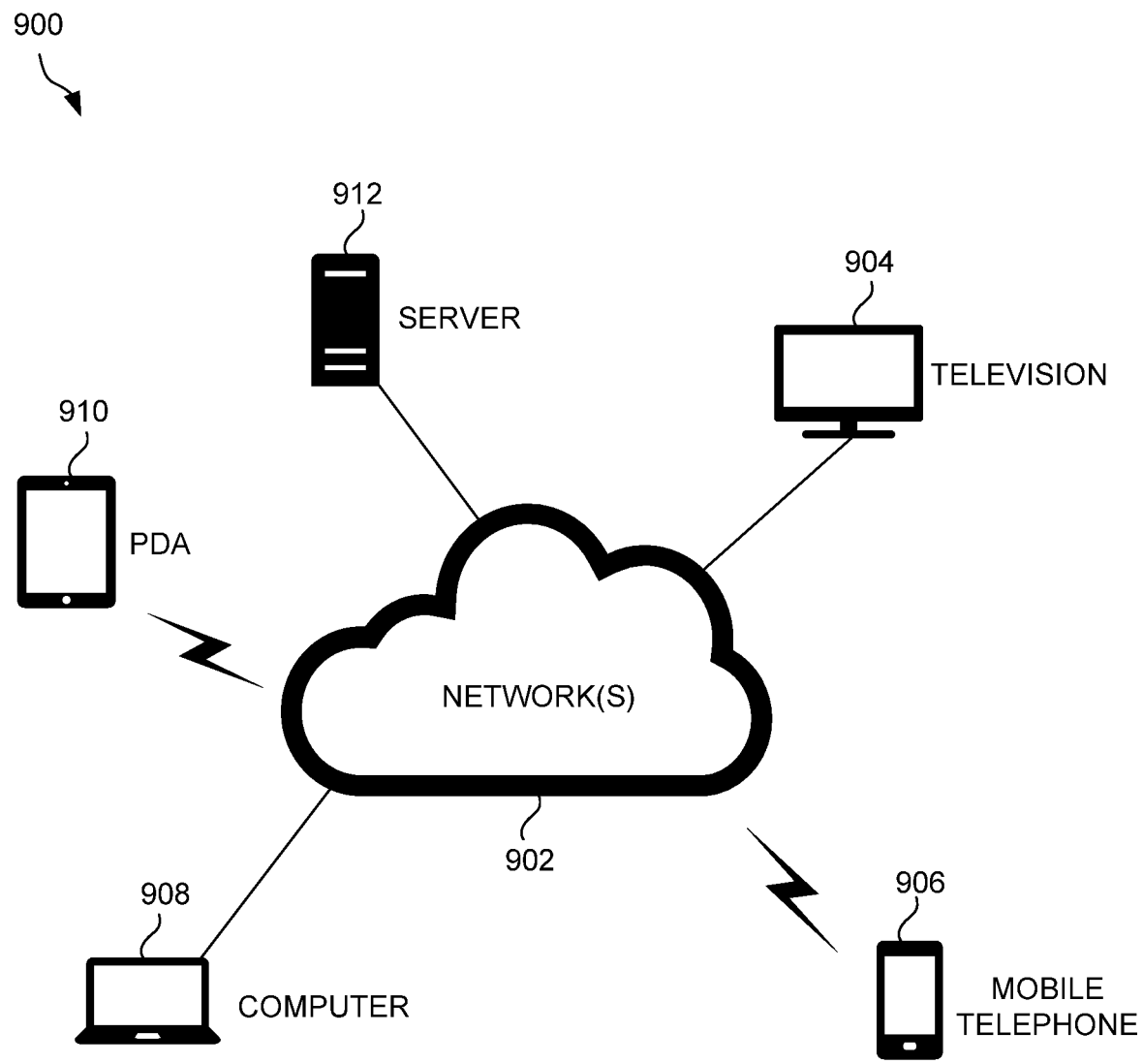
FIG. 9 illustrates a network architecture, in accordance with one possible embodiment.

FIG. 9 illustrates a network architecture 900, in accordance with one embodiment. As shown, at least one network 902 is provided. In various embodiments, any one or more components/features set forth during the description of any previous figure(s) may be implemented in connection with any one or more of the components of the at least one network 902.

In the context of the present network architecture 900, the network 902 may take any form including, but not limited to a telecommunications network, a local area network (LAN), a wireless network, a wide area network (WAN) such as the Internet, peer-to-peer network, cable network, etc. While only one network is shown, it should be understood that two or more similar or different networks 902 may be provided.

Coupled to the network 902 is a plurality of devices. For example, a server computer 912 and an end user computer 908 may be coupled to the network 902 for communication purposes. Such end user computer 908 may include a desktop computer, lap-top computer, and/or any other type of logic. Still yet, various other devices may be coupled to the network 902 including a personal digital assistant (PDA) device 910, a mobile phone device 906, a television 904, etc.

Figure 10:
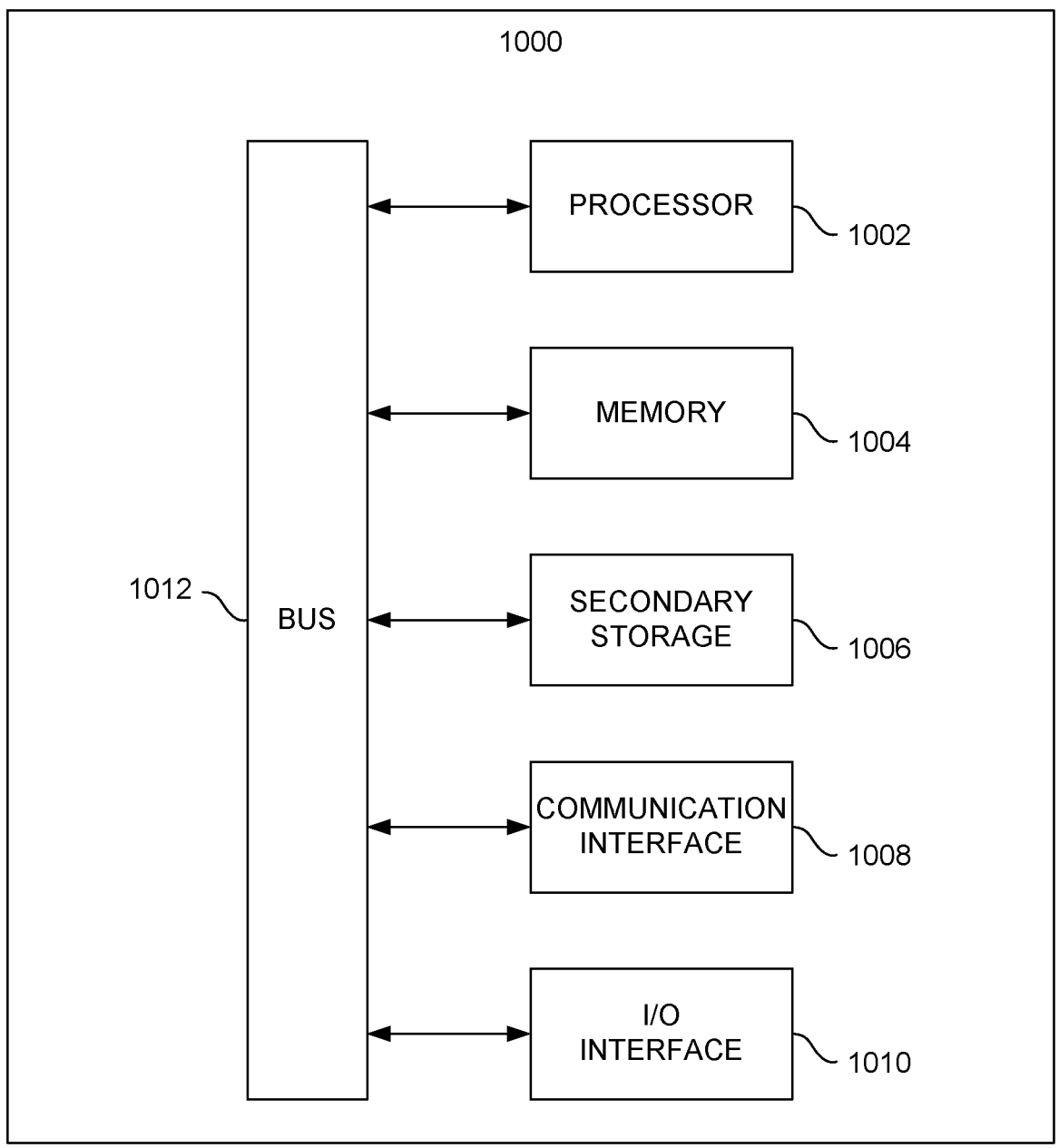
FIG. 10 illustrates an exemplary system, in accordance with one embodiment.

FIG. 10 illustrates an exemplary system 1000, in accordance with one embodiment. As an option, the system 1000 may be implemented in the context of any of the devices of the network architecture 900 of FIG. 9. However, it is to be appreciated that the system 1000 may be implemented in any desired environment.

As shown, a system 1000 is provided including at least one central processor 1002 which is connected to a bus 1012. Further included is a communication interface 1008 (e.g. local/remote network interface, memory access interface, etc.) and an input/output (I/O) interface 1010 (e.g. display, speaker, microphone, touchscreen, touchpad, mouse interface, the image sensor apparatus 700 shown in FIG. 7, etc.).

The system 1000 also includes main memory 1004 [e.g., hard disk drive, solid state drive, random access memory (RAM), etc.]. The system 1000 may also include a secondary storage 1006. The secondary storage 1006 includes, for example, a hard disk drive and/or a removable storage drive, representing a floppy disk drive, a magnetic tape drive, a compact disk drive, etc. The removable storage drive reads from and/or writes to a removable storage unit in a well-known manner.

Computer programs, or computer control logic algorithms, may be stored in the main memory 1004, the secondary storage 1006, and/or any other memory, for that matter. Such computer programs, when executed, enable the system 1000 to perform various functions (as set forth above including, but not limited to the method 800 of FIG. 8A, for example). Memory 1004, secondary storage 1006 and/or any other storage are possible examples of non-transitory computer-readable media.

It is noted that the techniques described herein, in an aspect, are embodied in executable instructions stored in a computer readable medium for use by or in connection with an instruction execution machine, apparatus, or device, such as a computer-based or processor-containing machine, apparatus, or device. It will be appreciated by those skilled in the art that for some embodiments, other types of computer readable media are included which may store data that is accessible by a computer, such as magnetic cassettes, flash memory cards, digital video disks, Bernoulli cartridges, random access memory (RAM), read-only memory (ROM), or the like.

As used here, a "computer-readable medium" includes one or more of any suitable media for storing the executable instructions of a computer program such that the instruction execution machine, system, apparatus, or device may read (or fetch) the instructions from the computer readable medium and execute the instructions for carrying out the described methods. Suitable storage formats include one or more of an electronic, magnetic, optical, and electromagnetic format. A non-exhaustive list of conventional exemplary computer readable medium includes: a portable computer diskette; a RAM; a ROM; an erasable programmable read only memory (EPROM or flash memory); optical storage devices, including a portable compact disc (CD), a portable digital video disc (DVD), a high definition DVD (HD-DVD™), a BLU-RAY disc; or the like.

Computer-readable non-transitory media includes all types of computer readable media, including magnetic storage media, optical storage media, and solid state storage media and specifically excludes signals. It should be understood that the software can be installed in and sold with the devices described herein. Alternatively the software can be obtained and loaded into the devices, including obtaining the software via a disc medium or from any manner of network or distribution system, including, for example, from a server owned by the software creator or from a server not owned but used by the software creator. The software can be stored on a server for distribution over the Internet, for example.

It should be understood that the arrangement of components illustrated in the Figures described are exemplary and that other arrangements are possible. It should also be understood that the various system components (and means) defined by the claims, described below, and illustrated in the various block diagrams represent logical components in some systems configured according to the subject matter disclosed herein.

For example, one or more of these system components (and means) may be realized, in whole or in part, by at least some of the components illustrated in the arrangements illustrated in the described Figures. In addition, while at least one of these components are implemented at least partially as an electronic hardware component, and therefore constitutes a machine, the other components may be implemented in software that when included in an execution environment constitutes a machine, hardware, or a combination of software and hardware.

More particularly, at least one component defined by the claims is implemented at least partially as an electronic hardware component, such as an instruction execution machine (e.g., a processor-based or processor-containing machine) and/or as specialized circuits or circuitry (e.g., discreet logic gates interconnected to perform a specialized function). Other components may be implemented in software, hardware, or a combination of software and hardware. Moreover, some or all of these other components may be combined, some may be omitted altogether, and additional components may be added while still achieving the functionality described herein. Thus, the subject matter described herein may be embodied in many different variations, and all such variations are contemplated to be within the scope of what is claimed.

In the description above, the subject matter is described with reference to acts and symbolic representations of operations that are performed by one or more devices, unless indicated otherwise. As such, it will be understood that such acts and operations, which are at times referred to as being computer-executed, include the manipulation by the processor of data in a structured form. This manipulation transforms the data or maintains it at locations in the memory system of the computer, which reconfigures or otherwise alters the operation of the device in a manner well understood by those skilled in the art. The data is maintained at physical locations of the memory as data structures that have particular properties defined by the format of the data. However, while the subject matter is being described in the foregoing context, it is not meant to be limiting as those of skill in the art will appreciate that various of the acts and operations described hereinafter may also be implemented in hardware.

To facilitate an understanding of the subject matter described herein, many aspects are described in terms of sequences of actions. At least one of these aspects defined by the claims is performed by an electronic hardware component. For example, it will be recognized that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

The embodiments described herein include the one or more modes known to the inventor for carrying out the claimed subject matter. It is to be appreciated that variations of those embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. An apparatus, comprising:
    an image sensor comprising a two-dimensional array of pixel elements, each pixel element to generate an output signal as pixel data for representing an image of a scene;
    a filter array comprising a two-dimensional array of filter elements coupled to the two-dimensional array of pixel elements to receive light input from the scene, the filter array arranged as a plurality of blocks of filter elements, each including:
        a first subset of color filter elements configured to transmit spectral energy in one or more colors of a visible spectrum of the light; and
        a second subset of infrared (IR) filter elements configured to transmit spectral energy in an IR spectrum of the light, the second subset of IR filter elements including at least four IR filter elements that are contiguous and form an N-by-N matrix, wherein N is an integer larger than 1; and
    at least one processor coupled with a non-transitory computer-readable storage medium storing programming instructions for execution by the at least one processor, wherein the programming instructions instruct the at least one processor to:
        select a first row of the two-dimensional array of filter elements;
        determine that the first row does not have any IR filter element;
        in response to determining that the first row does not have any IR filter element, perform a first processing to the first row;
        select a second row of the two-dimensional array of filter elements;
        determine that the second row has at least one IR filter element; and
        in response to determining that the second row has at least one IR filter element, perform a second processing to the second row, the second processing comprising binning one or more IR filter elements that are contiguous with the at least one IR filter element.

2. The apparatus of claim 1, wherein the image sensor includes a charge coupled device (CCD) image sensor.

3. The apparatus of claim 1, wherein the image sensor includes a complementary metal-oxide-semiconductor (CMOS) image sensor.

4. The apparatus of claim 1, wherein the first subset of color filter elements include at least two of: red color filter elements, green color filter elements, and blue color filter elements.

5. The apparatus of claim 1, wherein the first subset of color filter elements include red color filter elements, green color filter elements, and blue color filter elements.

6. The apparatus of claim 1, wherein the filter array is arranged such that a configuration of filter elements of each block is symmetric.

7. The apparatus of claim 1, wherein the second subset of IR filter elements includes a first number of filter elements that is a fraction of a second number of filter elements of the first subset of color filter elements.

8. The apparatus of claim 7, wherein the fraction is one-third (⅓).

9. The apparatus of claim 1, wherein the apparatus is configured such that the second subset of IR filter elements is centered within each corresponding block of filter elements.

10. The apparatus of claim 1, wherein the apparatus is configured such that the second subset of IR filter elements is positioned at a corner of each corresponding block of filter elements.

11. The apparatus of claim 1, wherein the programming instructions instruct the at least one processor to bin one or more IR filter elements that are contiguous with the at least one IR filter element by binning the spectral energy in the IR spectrum of the light for the at least one IR filter element and the one or more IR filter elements that are contiguous with the at least one IR filter element.

12. The apparatus of claim 11, wherein the binning the spectral energy in the IR spectrum of the light comprises binning voltage levels.

13. The apparatus of claim 11, wherein the binning the spectral energy in the IR spectrum of the light comprises binning charge levels.

14. The apparatus of claim 1, and further comprising binning circuitry that bins the spectral energy in the IR spectrum of the light for the at least one IR filter element and the one or more IR filter elements that are contiguous with the at least one IR filter element.

15. The apparatus of claim 1, wherein the apparatus is configured for binning the spectral energy in the one or more colors of the visible spectrum of the light for at least some of the first subset of color filter elements utilizing a first type of binning algorithm, and binning the spectral energy in the IR spectrum of the light for at least some of the second subset of IR filter elements utilizing a second type of binning algorithm.

16. The apparatus of claim 1, wherein the apparatus is configured for identifying a value of spectral energy in the one or more colors of the visible spectrum of the light for at least one of the second subset of IR filter elements, utilizing interpolation.

17. The apparatus of claim 1, wherein the first processing to the first row comprises processing an output associated with the first row utilizing a higher resolution; and the second processing to the second row comprises processing an output associated with the second row utilizing a lower resolution.

18. The apparatus of claim 1, wherein the apparatus is configured such that at least a portion of the second subset of IR filter elements form a single component of the filter array that is larger than at least one of the color filter elements of the first subset.

19. The apparatus of claim 1, wherein the apparatus is configured such that the color filter elements of the first subset are configured in a Bayer pattern.

20. A method, comprising:
receiving light at an apparatus comprising an image sensor comprising a two-dimensional array of pixel elements; and a filter array comprising a two-dimensional array of filter elements coupled to the two-dimensional array of pixel elements to receive light input from a scene, the filter array arranged as a plurality of blocks of filter elements each including a first subset of color filter elements configured to transmit spectral energy in one or more colors of a visible spectrum of the light, and a second subset of IR filter elements configured to transmit spectral energy in an infrared (IR) spectrum of the light, the second subset of IR filter elements including at least four IR filter elements that are contiguous and form an N-by-N matrix, wherein N is an integer larger than 1; and generating output signals for each of the pixel elements of the image sensor including pixel data representing an image of the scene;
selecting a first row of the two-dimensional array of filter elements;
determining that the first row does not have any IR filter element;
in response to determining that the first row does not have any IR filter element, performing a first processing to the first row;
selecting a second row of the two-dimensional array of filter elements;
determining that the second row has at least one IR filter element; and
in response to determining that the second row has at least one IR filter element, performing a second processing to the second row, the second processing comprising binning one or more IR filter elements that are contiguous with the at least one IR filter element.

21. The method of claim 20, wherein the second subset of IR filter elements includes a first number of filter elements that is a fraction of a second number of filter elements of the first subset of color filter elements.

22. The method of claim 20, wherein binning one or more IR filter elements that are contiguous with the at least one IR filter element comprises binning the spectral energy in the IR spectrum of the light for the at least one IR filter element and the one or more IR filter elements that are contiguous with the at least one IR filter element.

23. The method of claim 20, and further comprising:
binning the spectral energy in the one or more colors of the visible spectrum of the light for at least some of the first subset of color filter elements utilizing a first type of binning algorithm; and
binning the spectral energy in the IR spectrum of the light for at least some of the second subset of IR filter elements utilizing a second type of binning algorithm.

24. The method of claim 20, wherein the color filter elements of the first subset are configured in a Bayer pattern.

25. An apparatus, comprising:
an image sensor comprising a two-dimensional array of pixel elements, each pixel element to generate an output signal as pixel data for representing an image of a scene; and
a filter array comprising a two-dimensional array of filter elements coupled to the two-dimensional array of pixel elements to receive light input from the scene, the filter array arranged as a plurality of blocks of filter elements, each including a first subset of color filter elements configured to transmit spectral energy in one or more colors of a visible spectrum of the light and a second subset of infrared (IR) filter elements configured to transmit spectral energy in an IR spectrum of the light, wherein the second subset of IR filter elements including at least four IR filter elements that are contiguous and form an N-by-N matrix, wherein N is an integer larger than 1, and at least one of the IR filter elements of the second subset is larger than at least one of the color filter elements of the first subset; and
at least one processor coupled with a non-transitory computer-readable storage medium storing programming instructions for execution by the at least one processor, wherein the programming instructions instruct the at least one processor to:
select a first row of the two-dimensional array of filter elements;

determine that the first row does not have any IR filter element;

in response to determining that the first row does not have any IR filter element, perform a first processing to the first row;

select a second row of the two-dimensional array of filter elements;

determine that the second row has at least one IR filter element; and in response to determining that the second row has at least one IR filter element, perform a second processing to the second row, the second processing comprising binning one or more IR filter elements that are contiguous with the at least one IR filter element.

26. The apparatus of claim 25, wherein the apparatus is configured such that the color filter elements of the first subset are configured in a Bayer pattern.

* * * * *